United States Patent [19]
Kagawa et al.

[11] Patent Number: 5,483,095
[45] Date of Patent: Jan. 9, 1996

[54] OPTICAL SEMICONDUCTOR DEVICE

[75] Inventors: Hitoshi Kagawa; Koji Yamashita, both of Itami, Japan

[73] Assignee: Mitsubishi Denki Kabushiki Kaisha, Tokyo, Japan

[21] Appl. No.: 308,254

[22] Filed: Sep. 19, 1994

[30] Foreign Application Priority Data

Sep. 29, 1993 [JP] Japan .................................. 5-242363

[51] Int. Cl.$^6$ ........................... H01L 33/00; H01L 32/12
[52] U.S. Cl. ......................... 257/431; 257/437; 257/751; 437/209; 250/338.1; 359/588
[58] Field of Search ............................... 257/99, 82, 100, 257/81, 680, 434, 680, 89, 431; 250/338.1; 359/586, 589

[56] References Cited

U.S. PATENT DOCUMENTS

| | | | |
|---|---|---|---|
| 3,581,166 | 1/1969 | Suzuoka | 257/751 |
| 4,196,246 | 4/1980 | Takayama et al. | 359/588 |
| 4,355,321 | 10/1982 | Yeats | 257/437 |
| 4,749,659 | 6/1988 | Jarry | 257/441 |
| 4,803,360 | 2/1989 | Ball et al. | 250/338.1 |
| 4,810,671 | 3/1989 | Bhattacharyya et al. | 437/209 |
| 5,106,671 | 4/1992 | Amberger et al. | 428/215 |

OTHER PUBLICATIONS

"Optical Semiconductor Devices and Optical–Fiber Communication System", Mitsubishi Optoelectronics Data Book, 1990 pp. 120–121.

Primary Examiner—Sara W. Crane
Assistant Examiner—Jhihan Clark
Attorney, Agent, or Firm—Leydig, Voit & Mayer

[57] ABSTRACT

An optical semiconductor device including one of a light responsive semiconductor element, a light emitting semiconductor element, and a light responsive and light emitting semiconductor element, and a package hermetically sealing the semiconductor element. The package includes a window of silicon that selectively transmits light incident on the semiconductor element and emitted from the semiconductor element. The Si window is connected to the package body using a solder that makes a eutectic alloy with silicon. In this structure, since the eutectic alloy is produced at the junction of the Si window and the package body, the junction is not adversely affected by external influences, especially temperature. Further, since the Si window does not transmit light in the visible light region, the inside of the package cannot be seen from the outside through the Si window after fabrication of the device. Therefore, a completed device is not judged as a defective only from an abnormal appearance, whereby the production yield is improved. Further, since the Si window is produced using a conventional Si wafer and an apparatus used in a conventional wafer processing of semiconductor devices, the Si window is produced in a relatively simple process and at low cost.

3 Claims, 7 Drawing Sheets

OPTICAL SEMICONDUCTOR DEVICE

FIELD OF THE INVENTION

The present invention relates to optical semiconductor devices and, more particularly, to a semiconductor laser device used for optical fiber communication.

BACKGROUND OF THE INVENTION

FIG. 6 is a perspective view illustrating a semiconductor laser device using a conventional can-type hermetically sealed package. In FIG. 6, a semiconductor laser chip 104 is mounted on a heat sink 105 via a submount 106. The heat sink 105 with the laser chip 104 and a monitor photodiode 107 ante mounted on a base plate (eyelet part) 112 comprising iron or the like. Those elements on the base plate 112 are covered with a cap 100. The cap 100 comprises a cap body 10.1 and a window 116. The cap body 101 is made of Kovar alloy (an alloy containing Fe, Co, Ni, or the like) and has an opening at its top surface. The diameter of the opening is 3~4 mm. The window 116 is adhered to the cap body 101 using Pb containing glass 117, such as PbSn glass, covering the opening of the cap body 101. Reference numeral 108 designates a lead for the monitor photodiode 107, numeral 109 designates a lead for grounding, and numeral 110 is a lead for the laser chip 104. An Au wire 111 connects the laser chip 104 to the lead 110. An Au wire 118 connects the photodiode chip 107 to the lead 108. Generally, a semiconductor laser device used for optical communication has an oscillation wavelength of 0.98 μm, 1.2 μm, 1.3 μm, or 1.55 μm. For example, a laser chip including an InGaAs/GaAs multiquantum well structure is used for a laser device having an oscillation wavelength of 0.98 μm, and a laser chip comprising InGaAsP series materials is used for a laser device having an oscillation wavelength of 1.2 μm, 1.3 μm, or 1.55 μm. In this prior art device, the cap 100 is welded to the base plate 112, so that the package of the semiconductor laser device 200 is hermetically sealed.

FIGS. 7(a) and 7(b) are diagrams illustrating process steps in a method of fabricating the cap 100 of the semiconductor laser device 200. In these figures, the same reference numerals as in FIG. 6 designate the same or corresponding parts. Reference numeral 101a designates an opening of the cap body 101.

Initially, as illustrated in FIG. 7(a), a circular window 116, a cap body 101, and an annular glass plate 117 are prepared. The circular window 116 is formed by polishing or coating a glass plate used for optical parts and cutting the glass plate into a circular plate having a diameter of 3~4 mm. The cap body 101 has a circular opening whose diameter is smaller than the diameter of the window 116. The annular plate 117 comprises Pb containing glass and has an inside diameter larger than the diameter of the opening 101a and an outside diameter smaller than the diameter of the window 116.

Thereafter, as illustrated in FIG. 7(b), the annular glass plate 117 is put on the inner surface of the cap body 101 along the periphery of the opening 101a, and the window 116 is put on the annular glass plate 117. Then, the structure of FIG. 7(b) is heated in a furnace to melt the annular glass plate 117, whereby the window 116 is adhered to the cap body 101, producing the cap 100.

Thereafter, the cap 100 is fixed to the base plate 112 on which the laser chip 104 and the photodiode chip 107 are mounted, preferably by electric welding, resulting in the semiconductor laser device 200 shown in FIG. 6.

In operation, laser light emitted from the laser chip 104 is output through the window 116 and utilized as a desirable light source of a device utilizing the laser light.

In the above-described semiconductor laser device, since the window 116 is adhered to the cap body 101 using the Pb containing glass 117, when the Pb containing glass 117 can melt due to external influences, e.g. humidity, and contaminate the window 116, so that the characteristics of the laser device are degraded and the airtightness of the package is reduced.

Further, since the window 116 comprises glass, not only laser light but also visible light, i.e., light having a wavelength of 400~750 nm, is transmitted through the window 116. Therefore, the inside of the cap 100 can be visually observed through the window 116 after fabrication of the laser device. In this case, if the elements in the package look abnormal due to the arrangement of the elements, the device is judged as defective even though the performance of the device is normal, whereby the production yield is reduced.

Furthermore, since the window 116 comprises glass, the processing of the glass plate, such as polishing, coating, and cutting, is difficult, so that the production cost of the window 116 increases, resulting in an expensive cap 100.

Meanwhile, ELECTRON MATERIAL 21 (February 1983, p. 60) discloses an infrared sensor employing silicon as a window material that selectively transmits light having a prescribed wavelength, utilizing the fact that silicon does not transmit light having a wavelength shorter than 0.9 μm. In a light responsive optical semiconductor device having the above-described structure, a part of incident light having a desired wavelength is selected by and transmitted through the silicon window, so that the light responsive element responds to the light of the desired wavelength. In addition, the element is not adversely affected by an unwanted part of the incident light. Therefore, the performance of the optical semiconductor device is improved. However, since the silicon window and the cap body are connected with an adhesive, when the adhesive partially melts due to external influences, especially humidity, the window may be contaminated and the airtightness of the device reduced.

SUMMARY OF THE INVENTION

An object of the present invention is to provide an optical semiconductor device whose performance is not adversely affected by the external influences.

Another object of present invention is to provide an optical semiconductor device whose internal structure cannot be seen from the outside, and which is fabricated at low cost.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, an optical semiconductor device comprises one of a light responsive semiconductor element, a light emitting semiconductor element, and a light responsive and light emitting semiconductor element, and a package for hermetically sealing the semiconductor element. The package includes a window comprising silicon that selectively transmits light incident on the semiconductor element or emitted from the semiconductor element. The Si window is connected to the package body using a solder that forms an eutectic alloy with silicon. In this structure, since the eutectic alloy is produced at the junction of the Si window and the package body, the junction is not adversely affected by external influences, especially humidity. Further, since the Si window does not transmit visible light, the inside of the package cannot be seen from the outside through the Si window after fabrication of the device. Therefore, a completed device is not judged as defective from its abnormal appearance due to the arrangement of the elements included in the package, whereby the production yield is improved. Further, since the Si window is produced using a conventional Si wafer and an apparatus used in a conventional wafer processing of semiconductor devices, the Si window is produced in a relatively simple process at low cost.

According to a second aspect of the present invention, nonreflective films, each comprising a single or multilayer dielectric film, are disposed on the opposite front and rear surfaces of the Si window. Therefore, the reflection of light at the window is reduced, whereby the transmissivity of the window is improved.

According to a third aspect of the present invention, the nonreflective film comprises an $SiO_2$ film formed by oxidizing the surface of the Si window and a single or multilayer dielectric film disposed on the surface of the $SiO_2$ film. Therefore, the nonreflective film is easily produced utilizing the property that silicon is easily oxidized in air.

BRIEF DESCRIPTION OF THE DRAWINGS

FIGS. 1(a)–1(c) are diagrams for explaining a semiconductor laser device according to a first embodiment of the present invention, in which FIG. 1(a) is a sectional view of a cap, FIG. 1(b) is a sectional view of the laser device, and FIG. 1(c) is a perspective view of a window part.

DETAILED DESCRIPTION OF THE PREFERRED EMBODIMENTS

Figure 1:
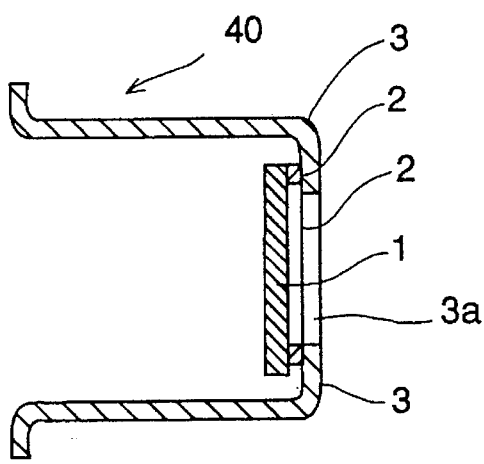
Figure 1:
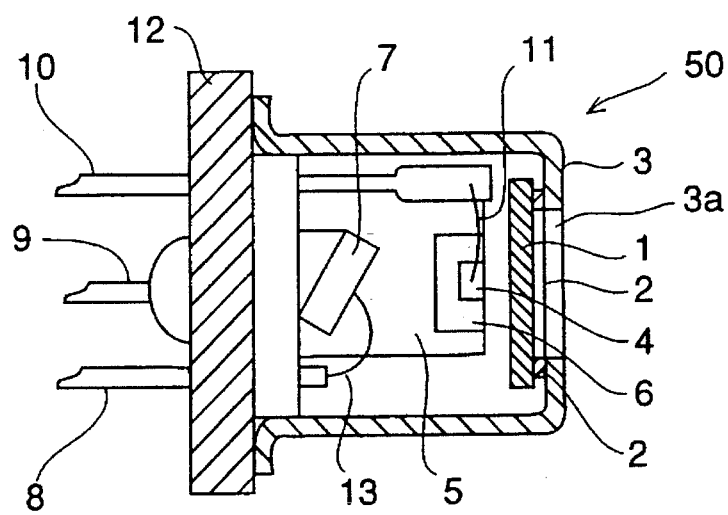
Figure 1:
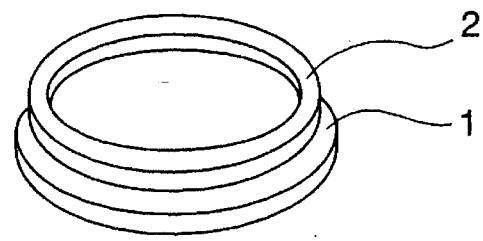

FIGS. 1(a)–1(c) are diagrams for explaining a structure of a semiconductor laser device in accordance with a first embodiment of the present invention. FIG. 1(a) is a sectional view of a cap, FIG. 1(b) is a sectional view of a laser device, and FIG. 1(c) is a perspective view of a window layer with solder. In FIG. 1(b), a semiconductor laser device 50 includes a cap 40. The cap 40 comprises a cap body 3 having a 3~4 gm diameter opening 3a and a circular window 1 comprising silicon and having a diameter larger than the diameter of the opening 3a and a thickness of 300–400 µm. The window 1 is connected to the cap body 3 with an annular Au solder having a thickness of several microns. The inside diameter of the solder 2 is the same as or larger than the diameter of the opening 3a, and the outside diameter of the solder 2 is the same as or smaller than the diameter of the window 1. A semiconductor laser chip 4 having an oscillation wavelength exceeding 0.9 µm is mounted on a heat sink 5 comprising Ag or the like via a submount 6. The heat sink 5 with the laser chip 4 is mounted on a base plate 12. Preferably, the base plate 12 comprises Fe. In addition, a photodiode chip 7 for monitoring laser light emitted from the laser chip 4 is mounted on the base plate 12. The laser chip 4 is connected to a lead 10 with an Au wire 11. The monitor photodiode 7 is connected to a lead 8 with an Au wire 13. Reference numeral 9 designates a lead for grounding.

Production of the cap 40 is illustrated in FIGS. 2(a)–2(d). In these figures, the same reference numerals as in FIGS. 1(a)–1(c) designate the same or corresponding parts. Reference numeral 20 designates an Si wafer having a specular surface that is usually employed for fabrication of semiconductor devices. Reference numeral 2a designates an Au film formed on the wafer 20.

Figure 2:
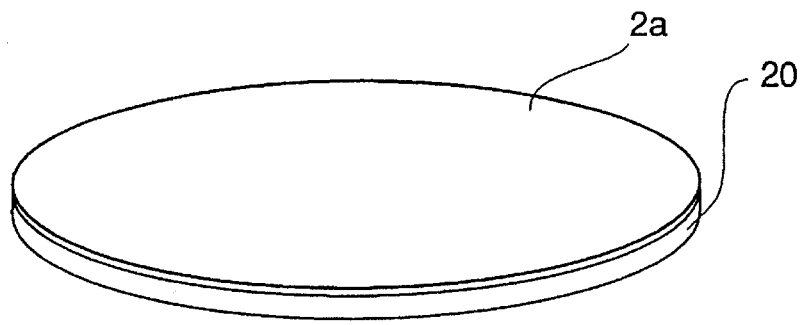
FIGS. 2(a)–2(d) are diagrams illustrating process steps in a method of fabricating the cap of the semiconductor laser device shown in FIG. 1(a).
Figure 2:
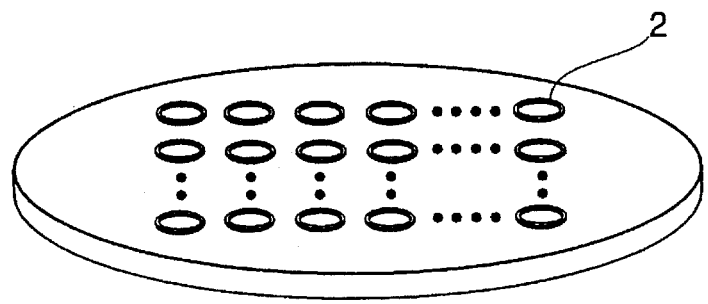
Figure 2:
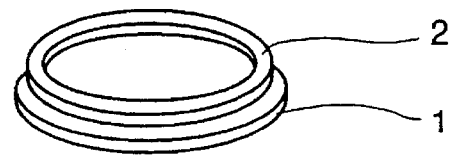
Figure 2:
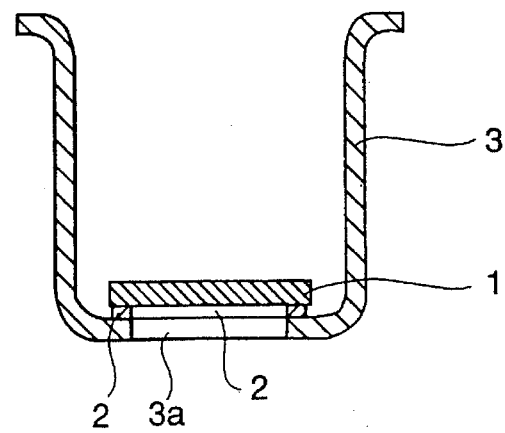

Initially, as illustrated in FIG. 2(a), an Au film 2a having a thickness of several microns is deposited on an Si wafer 20 having a thickness of 300–400 µm. Thereafter, the Au film 2a is patterned to form a plurality of annular Au solder regions 2 (FIG. 2(b)). An Au—Si eutectic alloy is formed at the boundary between the solder 2 and the Si wafer 20. Thereafter, the wafer is cut along the periphery of each region 2, preferably by etching, producing a window 1 with the solder 2 shown in FIG. 2(c).

In the step of FIG. 2(d), the window 1 is put in the cap body 3 with the solder 2 in contact with the periphery of the opening 3a of the cap body 3. Thereafter, the cap body 3 with the window 1 is heated to melt the solder 2, whereby the window 1 is fixed to the cap body 3. Finally, the cap body 3 is welded to the base plate 12, whereby the elements on the base plate 12 are hermetically sealed.

In the above-described first embodiment of the invention, the window 1 comprises silicon. Since silicon has a band gap energy of about 1.1 eV, it absorbs light having an energy higher than about 1.1 eV, i.e., light having a wavelength shorter than about 1.1 µm, but does not absorb light having an energy lower than about 1.1 eV, i.e., light having a wavelength longer than about 1.1 µm. In addition, silicon partially absorbs light having a wavelength in a range of 0.9~1.1 µm although the absorption coefficient of silicon of light in that wavelength range is not adequately large,. That is, silicon does not transmit light having a wavelength shorter than 0.9 µm but transmits light having a wavelength longer than 0.9 µm. Therefore, in the semiconductor laser device 50 including the laser chip 4 having an oscillation wavelength longer than 0.9 µm, the Si window 1 does not adversely affect the performance of the laser device. Since laser devices having oscillation wavelengths of 1.2 µm, 1.3 µm, and 1.55 µm are widely employed in present optical communication, it is possible to use a cap having an Si window in a laser device for optical communication.

Further, since the window 1 comprises silicon, the window 1 can be adhered to the cap body 3 using the Au solder 2. In this case, an eutectic alloy is produced between the solder 2 and the Si window 1, so that the stability of the solder 2 against external influences, especially humidity, is improved. That is, in contrast to the prior art Pb containing glass, the Au solder 2 does not melt due to moisture and does not contaminate the window 1. Therefore, the performance of the laser device is not degraded and the airtightness of the package is not reduced.

Furthermore, since the Si window 1 does not transmit visible light having a wavelength shorter than 0.9 µm, the inside of the completed device cannot be seen through the window 1. Therefore, the appearance of the laser device is not damaged by the arrangement of the elements in the package, significantly reducing the visual inferiority of the laser device.

Furthermore, the window 1 is produced using an inexpensive monocrystalline silicon wafer and an apparatus for a conventional wafer processing and, therefore, a plurality of window layers are synchronously produced and the cost of the window is significantly reduced.

As described above, according to the first embodiment of the present invention, silicon is used as a material of the window 1 of the semiconductor laser device 50, and the window 1 is connected to the cap body 3 with the Au solder 2 that makes an Au—Si eutectic alloy with Si. Therefore, the connection between the window 1 and the cap body 3 is improved, resulting in a highly-reliable semiconductor laser device.

While in the above-described first embodiment an Au solder is employed, an Au—Si base solder may be employed with the same effects as described above.

Figure 3:
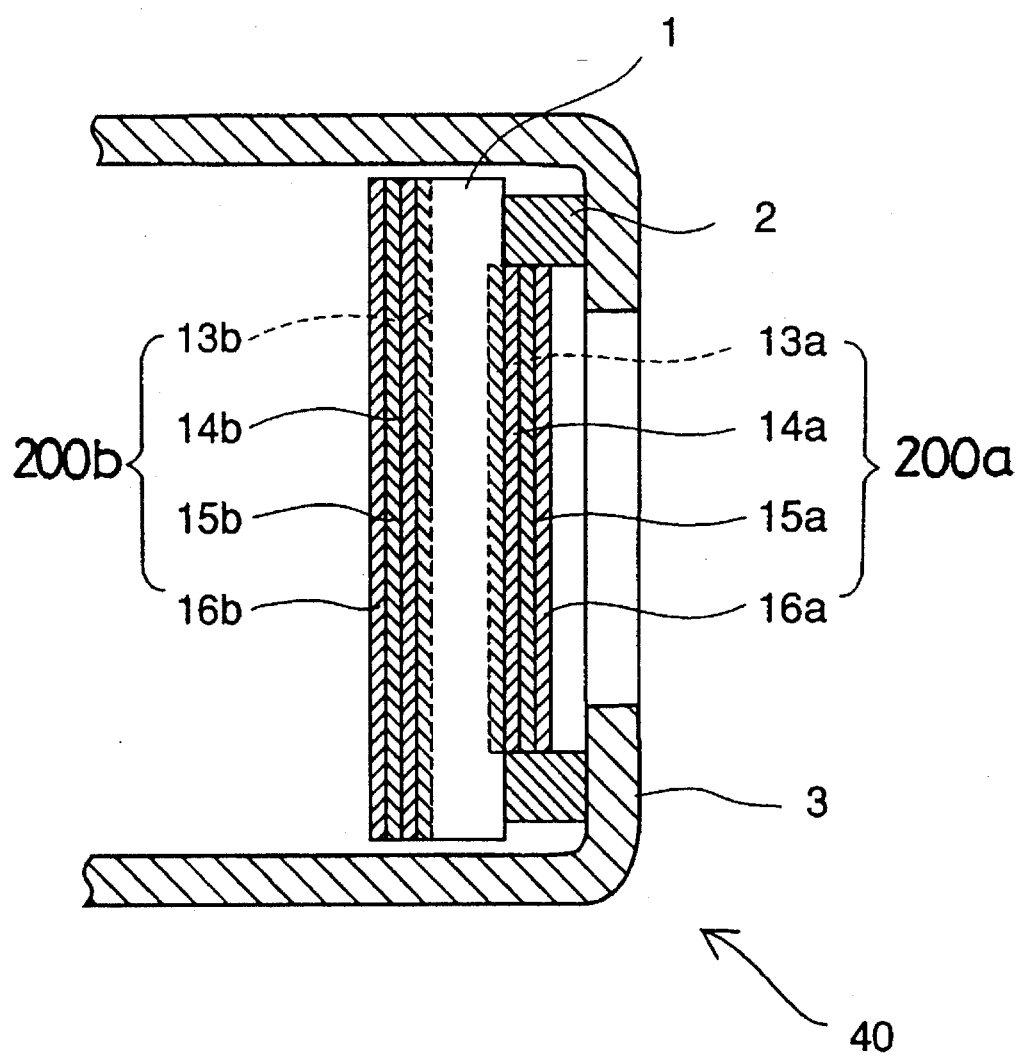
FIG. 3 is a sectional view illustrating a window structure of a semiconductor laser device in accordance with a second embodiment of the present invention.

FIG. 3 is a sectional view illustrating a window part of a cap of a semiconductor laser device in accordance with a second embodiment of the present invention. In the figure, the same reference numerals as in FIG. 1(a) designate the same or corresponding parts. In this second embodiment of the invention, nonreflective films 200a and 200b are disposed on the front and rear surfaces of the window 1. Reference numerals 13a and 13b designate $SiO_2$ films formed on the front and rear surfaces of the Si window 1 by thermal oxidation. The thickness of the $SiO_2$ film is equivalent to $\lambda/2n1$ where $\lambda$ is the wavelength of the light produced by the semiconductor laser device and n1 is the refractive index of $SiO_2$. Reference numerals 14a, 14b, 16a, and 16b designate $Al_2O_3$ films produced by sputtering or vapor deposition. The thickness of the $Al_2O_3$ film is equivalent to $\lambda/4n2$ where n2 is the refractive index of $Al_2O_3$. Reference numerals 15a and 15b designate $SiO_2$ films formed by sputtering or vapor deposition. The thickness of the $SiO_2$ film is equivalent to $\lambda/4n1$. The nonreflective film 200a comprising the $SiO_2$ film 13a, the $Al_2O_3$ film 14a, the $SiO_2$ film 15a, and the $Al_2O_3$ film 16a is disposed on the front surface of the window 1, and the nonreflective film 200b comprising the $SiO_2$ film 13b, the $Al_2O_3$ film 14b, the $SiO_2$ film 15b, and the $Al_2O_3$ film 16b is disposed on the rear surface of the window 1 layer.

FIGS. 4(a)–4(h) are sectional views illustrating process steps in a method of fabricating the window structure shown in FIG. 3. In the figures, the same reference numerals as in FIG. 3 designate the same or corresponding parts. Reference numeral 17 designates a resist film.

Figure 4:
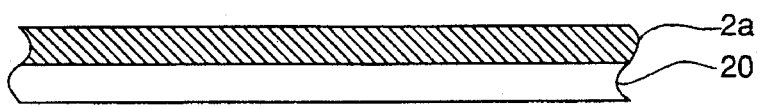
FIGS. 4(a)–4(h) are sectional views illustrating process steps in a method of fabricating the window structure of the semiconductor laser device according to the second embodiment.
Figure 4:
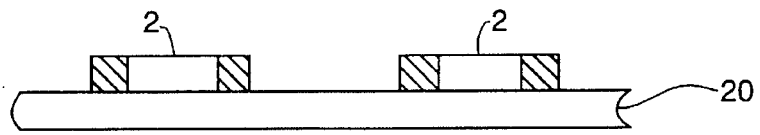
Figure 4:
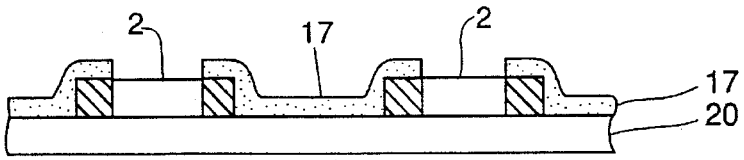
Figure 4:
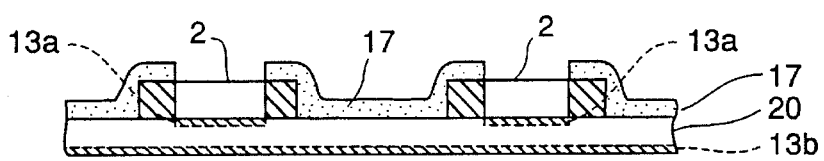
Figure 4:
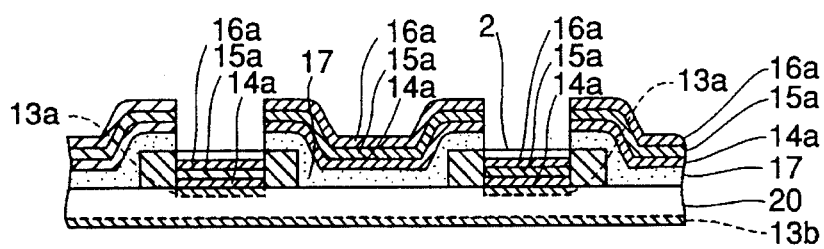
Figure 4:
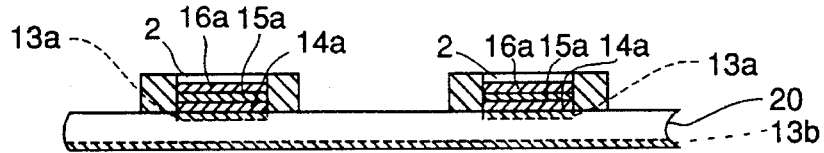
Figure 4:
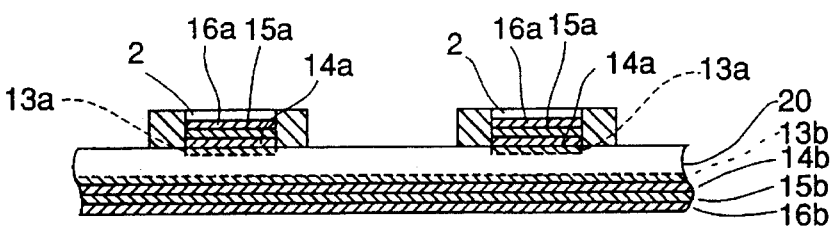
Figure 4:
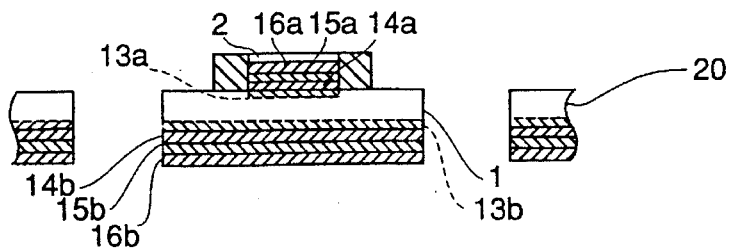

Initially, as illustrated in FIG. 4(a), an Au film 2a several microns thick is deposited on an Si substrate 20 300–400 µm thick. Then, the Au film 2a is patterned to form a plurality of annular Au solder regions 2 each having an inside diameter of 3–4 mm (FIG. 4(b)). An Au—Si eutectic alloy is produced at the boundary between the Au solder 2 and the Si substrate 20.

In the step of FIG. 4(c), a resist film 17 is deposited on the substrate 20 and on the annular Au solder regions 2, excluding portions of the substrate 20 surrounded by the annular Au solder regions 2. Using the resist film 17 as a mask, by thermal oxidation, an $SiO_2$ film 13a is selectively formed on the portions of the Si substrate 20 where the resist film 17 is absent, and an $SiO_2$ film 13b is formed on the rear surface of the Si substrate 20 (FIG. 4(d)).

In the step of FIG. 4(e), an $Al_2O_3$ film 14a, an $SiO_2$ film 15a, and an $Al_2O_3$ film 16a are successively deposited on the $SiO_2$ film 13a, preferably by sputtering or vapor deposition. Thereafter, as illustrated in FIG. 4(f), the resist film 17 and unnecessary portions of the films 14a, 15a, and 16a on the resist film 17 are removed by a lift-off technique. Further, as illustrated in FIG. 4(g), an $Al_2O_3$ film 14b, an $SiO_2$ film 15b, and an $Al_2O_3$ film 16b are successively formed on the $SiO_2$ film 13b on the rear surface of the substrate 20, preferably by sputtering or vapor deposition.

Thereafter, the wafer is cut along the periphery of the solder 2, preferably by etching, resulting in a window structure 1 having nonreflective films 200a and 200b on the opposite front and rear surfaces, respectively (FIG. 4(h)). Finally, the window structure 1 is adhered to the cap body 3 using the solder 2, resulting in the cap 40 shown in FIG. 3.

Figure 5:
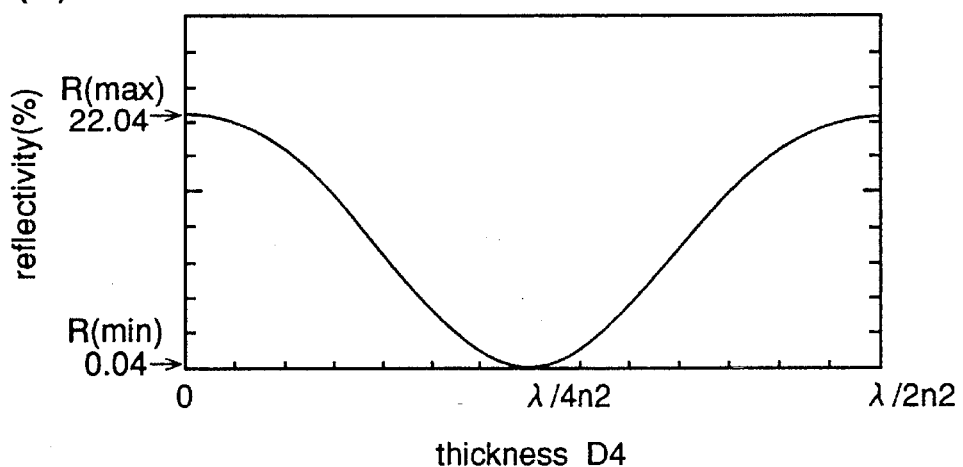
FIG. 5(a) is a graph illustrating a result of a simulation of reflectivity of a nonreflective film disposed at the surface of the window structure of FIG. 3.
FIG. 5(b) illustrates a model of the nonreflective film used in the simulation.
Figure 5:
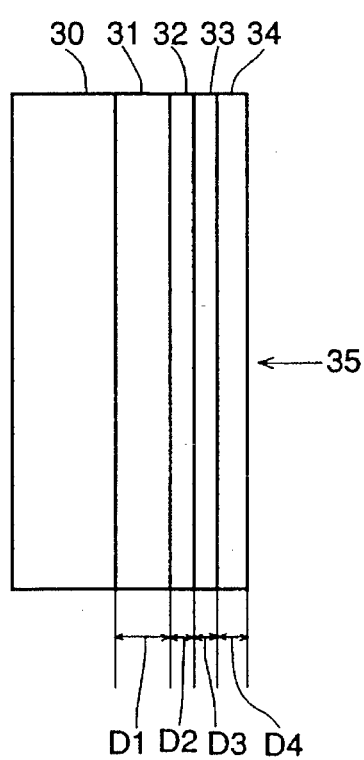
Figure 6:
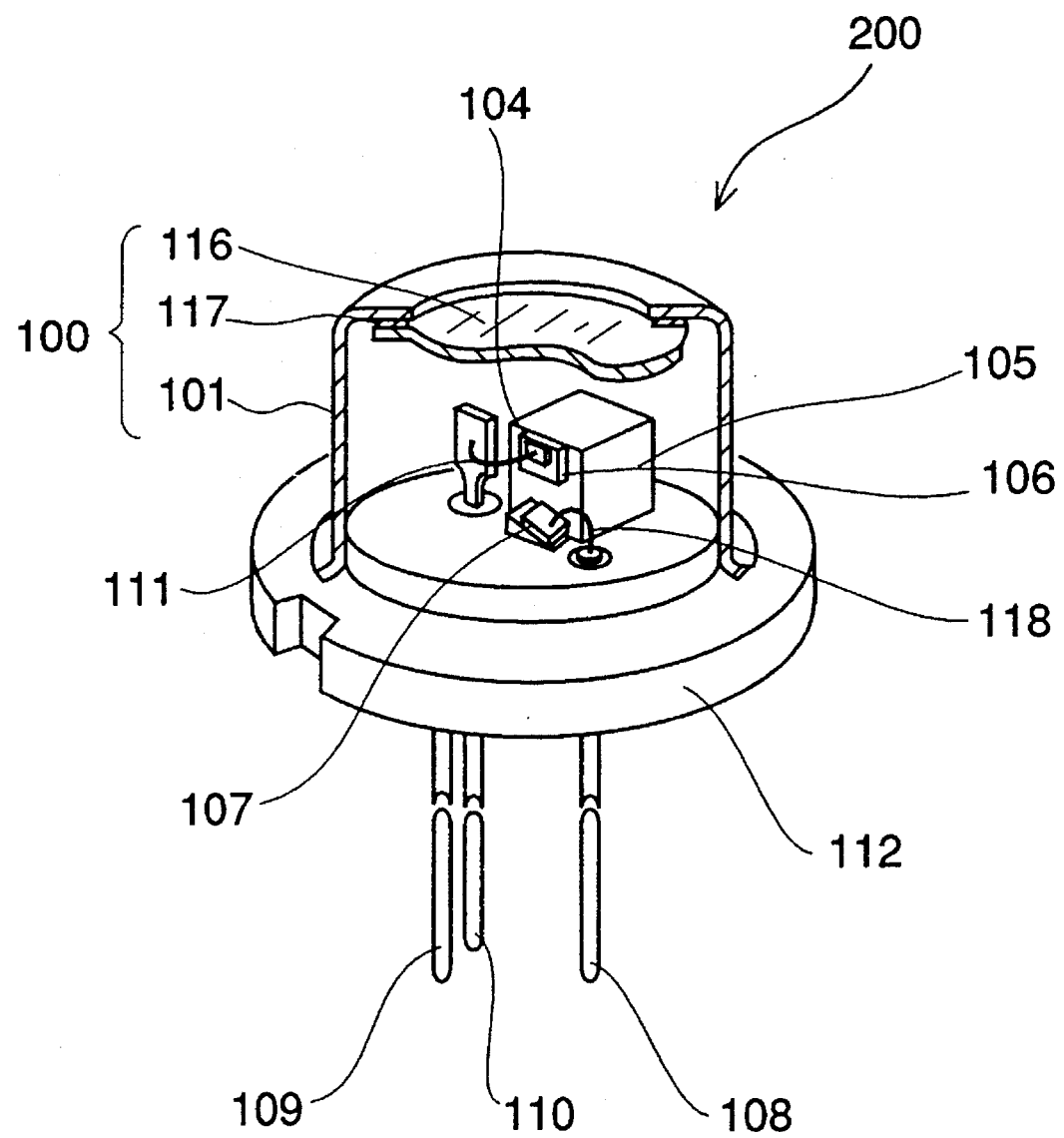
FIG. 6 is a perspective view illustrating a semiconductor laser device according to the prior art.
Figure 7:
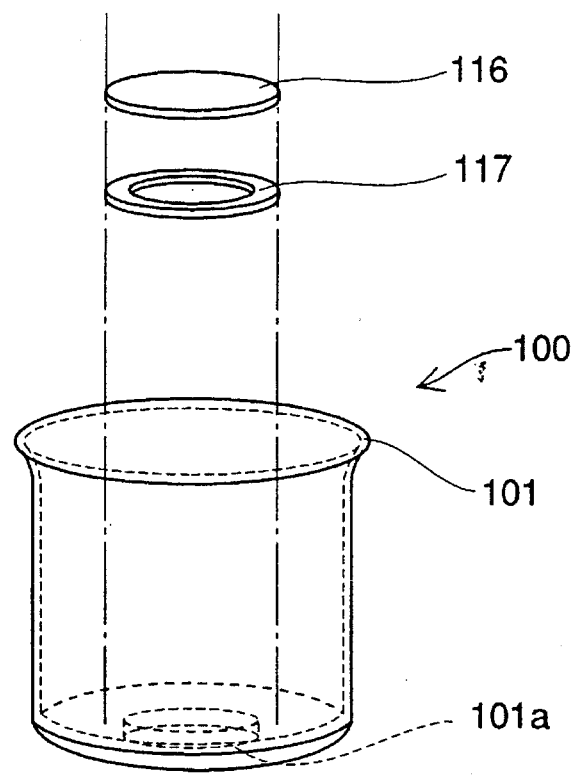
FIGS. 7(a) and 7(b) are a perspective view and a sectional view illustrating process steps in a method of fabricating a cap of the semiconductor laser device shown in FIG. 6.
Figure 7:
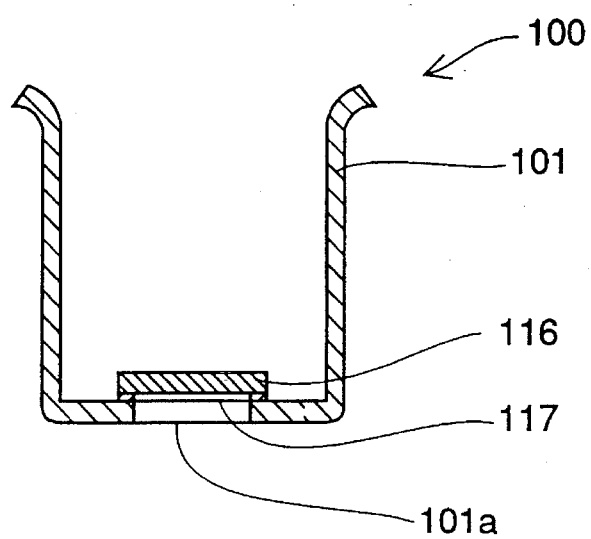

FIGS. 5(a) and 5(b) are diagrams for explaining a result of a simulation of the reflectivity of the nonreflective film comprising the above-described four films on the Si window. In the simulation, it is assumed that the thickness of the uppermost $Al_2O_3$ film of the nonreflective film varies from the prescribed thickness $\lambda/4n2$ in a range of ±100%. FIG. 5(b) illustrates a model of the window structure with the nonreflective film employed in the simulation. In FIG. 5(b), reference numeral 30 designates an Si window. A nonreflective film disposed on the Si window 30 comprises an $SiO_2$ film 31 having a thickness D1 of $\lambda/2n1$, an $Al_2O_3$ film 32 having a thickness D2 of $\lambda/4n2$, an $SiO_2$ film 33 having a thickness of D3 of $\lambda/2n1$, and an $Al_2O_3$ film 34 having a thickness D4 that is variable in a range from 0 to $\lambda/4n2$. Reference numeral 35 designates incident light having a wavelength $\lambda$. FIG. 5(a) is a graph illustrating the relationship between the thickness D4 of the uppermost $Al_2O_3$ film 34 and the reflectivity R at the surface of that film, in which the abscissa shows the variation in the thickness D4 of the $Al_2O_3$ film 34 with the thickness of $\lambda/4n2$ as 100%, and the ordinate shows the variation in the reflectivity R according to variation in the thickness D4. In this simulation, the refractive index n1 of $SiO_2$ is 1.45, the refractive index n2 of $Al_2O_3$ is 1.63, and the refractive index of the Si window is 3.50.

As shown in FIG. 5(a), in the nonreflective film according to this second embodiment, when the thickness D4 of the uppermost $Al_2O_3$ film 34 is 0 or $\lambda/2n2$, the reflectivity R attains a maximum value (22.04%). When the thickness D4 is $\lambda/4n2$, the reflectivity R attains a minimum value (0.04%). That is, when the thickness D4 of the uppermost $Al_2O_3$ film 34 is $\lambda/4n2$, the reflectivity of the nonreflective film is 0.04%, providing a nonreflective film with an adequate function.

Since the $SiO_2$ films 13a and 13b of the nonreflective film are produced utilizing a chemical reaction in which the surface of the Si wafer is converted to $SiO_2$ when heated, the formation of the nonreflective film is simplified.

As described above, according to the second embodiment of the present invention, silicon is used as a material of the window 1 of the semiconductor laser device, and the nonreflective film disposed on the Si window 1 includes the $SiO_2$ films 13a and 13b which are produced by thermally oxidizing the Si window 1. Therefore, unwanted reflection of incident light on the window is suppressed, and a high-performance semiconductor laser device is produced in a relatively simple process.

Furthermore, the window 1 with the nonreflective film is produced using an inexpensive monocrystalline silicon wafer and an apparatus used for conventional wafer processing. Therefore, a high-performance window is produced at low cost.

While in the above-described second embodiment a multilayer nonreflective film comprising alternatingly laminated $SiO_2$ films and $Al_2O_3$ films is employed, a single or multilayer nonreflective film comprising other dielectric materials may be employed with the same effects as described above.

Although in the above-described first and second embodiments the Si window is adhered to the cap body comprising a material other than Si, using a solder that makes an eutectic alloy with Si, the present invention may be applied to a cap structure in which a window part and a cap body, both comprising silicon, are united. In this case, the cap is adhered to the base plate using a solder that makes an eutectic alloy with Si, so that the same effects as described above are achieved.

While in the present invention an optical semiconductor device including a semiconductor laser chip as an optical semiconductor element is described, the present invention may be applied to optical semiconductor devices including a light emitting diode, a photodiode, or a light responsive and light emitting element.

What is claimed is:

1. An optical semiconductor device comprising:
   one of a light responsive semiconductor element, a light emitting semiconductor element, and a light responsive and light emitting semiconductor element;
   a package hermetically sealing the semiconductor element, the package comprising a package body and a window comprising a silicon body having front and rear surfaces that selectively transmits light incident on the semiconductor element and emitted from the semiconductor element;
   a non-reflection film disposed on each of the front and rear surfaces of the silicon body, each of the non-reflection films comprising:
   a first $SiO_2$ layer produced by oxidizing a surface of the window and having a thickness of $\lambda/2n1$ where $\lambda$ is the wavelength of light passing through the window, and n1 is the refractive index of $SiO_2$;
   a first $Al_2O_3$ layer disposed on the first $SiO_2$ layer and having a thickness of $\lambda/4n2$ where n2 is the refractive index of $Al_2O_3$;
   a second $SiO_2$ layer disposed on the first $Al_2O_3$ layer and having a thickness of $\lambda/4n1$; and
   a second $Al_2O_3$ layer disposed on the second $SiO_2$ layer and having a thickness of $\lambda/4n2$; and
   a solder connecting the window to the package body, the solder forming a eutectic alloy with silicon.

2. The optical semiconductor device of claim 1 wherein the solder is selected from the group consisting of Au solder and Au—Si base solder.

3. An optical semiconductor device comprising:
   one of a light responsive semiconductor element, a light emitting semiconductor element, and a light responsive and light emitting semiconductor element; and
   a package hermetically sealing the semiconductor element, the package including a window comprising a silicon body having front and rear surfaces and that selectively transmits light incident on the semiconductor element and emitted from the semiconductor element, wherein a non-reflection film is disposed on each of the front and rear surfaces, each of the non-reflection films comprising:
   a first $SiO_2$ layer produced by oxidizing a surface of the window and having a thickness of $\lambda/2n1$ where $\lambda$ is the wavelength of light passing through the window, and n1 is the refractive index of $SiO_2$;
   a first $Al_2O_3$ layer disposed on the first $SiO_2$ layer and having a thickness of $\lambda/4n2$ where n2 is the refractive index of $Al_2O_3$;
   a second $SiO_2$ layer disposed on the first $Al_2O_3$ layer and having a thickness of $\lambda/4n1$; and
   a second $Al_2O_3$ layer disposed on the second $SiO_2$ layer and having a thickness of $\lambda/4n2$.

* * * * *